(12) United States Patent
Boivin et al.

(10) Patent No.: US 11,031,550 B2
(45) Date of Patent: Jun. 8, 2021

(54) PHASE-CHANGE MEMORY CELL HAVING A COMPACT STRUCTURE

(71) Applicants: STMicroelectronics (Crolles 2) SAS, Crolles (FR); STMICROELECTRONICS (ROUSSET) SAS, Rousset (FR)

(72) Inventors: Philippe Boivin, Venelles (FR); Simon Jeannot, Grenoble (FR)

(73) Assignees: STMicroelectronics (Crolles 2) SAS, Crolles (FR); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/457,855

(22) Filed: Jun. 28, 2019

(65) Prior Publication Data

US 2019/0326510 A1 Oct. 24, 2019

Related U.S. Application Data

(62) Division of application No. 15/654,405, filed on Jul. 19, 2017, now abandoned, which is a division of (Continued)

(30) Foreign Application Priority Data

Jun. 23, 2015 (FR) ..................................... 1555733

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *H01L 27/2436* (2013.01); *H01L 27/2463* (2013.01);
(Continued)

(58) Field of Classification Search
CPC ............ H01L 27/2427; H01L 27/2436; H01L 27/2454–249; H01L 45/06–065;
(Continued)

(56) References Cited

U.S. PATENT DOCUMENTS 7,479,671 B2 1/2009 Breitwisch et al.
8,043,888 B2 * 10/2011 Mathew .............. H01L 45/1226
438/102
(Continued)

FOREIGN PATENT DOCUMENTS

EP 1 845 567 A1 10/2007
JP 9-82912 A 3/1997

OTHER PUBLICATIONS

U.S. Appl. No. 14/970,347, filed Dec. 15, 2015, Resistive Memory Cell Having a Compact Structure.
(Continued)

*Primary Examiner* — Vincent Wall
(74) *Attorney, Agent, or Firm* — Seed IP Law Group LLP

(57) ABSTRACT

A memory cell includes a selection transistor having a control gate and a first conduction terminal connected to a variable-resistance element. The memory cell is formed in a wafer comprising a semiconductor substrate covered with a first insulating layer, the insulating layer being covered with an active layer made of a semiconductor. The gate is formed on the active layer and has a lateral flank covered with a second insulating layer. The variable-resistance element includes a first layer covering a lateral flank of the active
(Continued)

layer in a trench formed through the active layer along the lateral flank of the gate and reaching the first insulating layer, and a second layer made of a variable-resistance material.

20 Claims, 4 Drawing Sheets

Related U.S. Application Data application No. 15/098,025, filed on Apr. 13, 2016, now Pat. No. 9,735,353.

(52) U.S. Cl.
CPC ........ *H01L 45/124* (2013.01); *H01L 45/1206* (2013.01); *H01L 45/126* (2013.01); *H01L 45/1226* (2013.01); *H01L 45/1233* (2013.01); *H01L 45/144* (2013.01); *H01L 45/16* (2013.01); *H01L 45/1666* (2013.01); *G11C 13/0004* (2013.01); *G11C 2213/79* (2013.01); *G11C 2213/82* (2013.01)

(58) Field of Classification Search
CPC ....... H01L 45/122; H01L 45/1233–124; H01L 45/1253–128; H01L 45/128; H01L 45/1206
See application file for complete search history.

(56) References Cited

U.S. PATENT DOCUMENTS

| | | | |
|---|---|---|---|
| 8,471,233 | B2 | 6/2013 | Aozasa |
| 8,698,118 | B2* | 4/2014 | Toh ..................... H01L 27/2436 257/2 |
| 9,455,343 | B2 | 9/2016 | Pillarisetty et al. |
| 2007/0254428 | A1 | 11/2007 | Willer et al. |
| 2009/0014706 | A1 | 1/2009 | Lung |
| 2010/0001248 | A1 | 1/2010 | Wouters et al. |
| 2010/0019299 | A1 | 1/2010 | Bae |
| 2010/0032641 | A1 | 2/2010 | Mikawa et al. |
| 2012/0243307 | A1 | 9/2012 | Takashima |
| 2013/0140513 | A1* | 6/2013 | Lai ........................ H01L 45/126 257/4 |
| 2015/0144862 | A1 | 5/2015 | Choi et al. |

OTHER PUBLICATIONS

U.S. Appl. No. 15/694,463, filed Sep. 1, 2017, Resistive Memory Cell Having a Compact Structure.
U.S. Appl. No. 16/357,152, filed Mar. 18, 2019, Resistive Memory Cell Having a Compact Structure.
Deng, F. et al., "Salicidation process using NiSi and its device application," J. Appl. Phys 81(12):8047-8051, Jun. 15, 1997.
Gambino, J.P. et al., "Silicides and ohmic contacts," Materials Chemistry and Physics 52:99-146, 1998.

* cited by examiner

PHASE-CHANGE MEMORY CELL HAVING A COMPACT STRUCTURE

BACKGROUND

Technical Field

The present disclosure relates to phase-change memories, and more generally memories in which each memory cell comprises a selection transistor and a variable-impedance element which is able to exhibit a number of different states detectable by an impedance measurement. Depending on whether the element is able to preserve its state when its power supply is turned off, the memory is either volatile or nonvolatile.

Description of the Related Art

FIGS. 1A and 1B schematically show in cross section a semiconductor substrate SUB on which has been formed a memory cell MC11 comprising a variable-resistance element VZ. FIG. 1A is a longitudinal cross-sectional view of the plane AA' indicated in FIG. 1B, and FIG. 1B is a transverse cross-sectional view of the plane BB' indicated in FIG. 1A. The memory cell MC11 comprises a selection transistor comprising a gate GT, (drain or source) conduction regions DDP and SDP on either side of the gate GT, and a channel region under the gate GT between the conduction regions DDP, SDP. The gate GT is produced in a layer made of polysilicon formed on an insulating layer GO deposited on the substrate SUB. The regions DDP, SDP are formed by implanting dopants into the substrate SUB on each side of the gate GT. The memory cell MC11 is covered with a dielectric insulator D1. The conduction region SDP is connected to a source line SL by way of a via passing through the insulating layer D1. The gate GT forms a word line WL lying parallel to the source line SL. The variable-resistance element VZ is formed in the insulating layer D1 and is connected to the conduction region DDP by way of a via formed in the insulating layer D1. The variable-resistance element VZ is connected to a bit line BL formed on the surface of the insulating layer D1 by way of a via BC formed in the insulating layer D1. The bit line BL runs perpendicular to the word line WL and source line SL. The memory cell is isolated from adjacent memory cells (or other circuit elements formed on the substrate SUB) by shallow trench isolations STI1 parallel to the gate GT, and shallow trench isolations STI2 perpendicular to the gate GT. The trench isolations STI1 may be replaced by transistor gates (such as the gate GT) that are biased so as to maintain the associated transistor in the off state (not shown).

The variable-resistance element VZ is made of a material able to pass from an amorphous phase to a crystalline phase and vice versa, under the effect of heat. In its amorphous form, the element VZ has a high resistance, and in the crystalline form its resistance is low. The element VZ is therefore associated in series with a heating element HT that heats up under the effect of a current flow. The amorphous form is obtained by applying a current peak to the heating element HT, whereas the crystalline form is obtained by a slower cooling of the element VZ achieved by gradually decreasing the current flowing through the heating element HT. Certain phase-change materials may be controlled to exhibit more than two phases having different resistances, thereby making it possible to store a plurality of bits in a single memory cell.

FIG. 2 shows the electric circuit of one portion of a memory plane comprising memory cells such as the memory cell MC11 shown in FIGS. 1A and 1B. The memory plane comprises word lines WL, source lines SL parallel to the word lines WL and bit lines perpendicular to the word lines WL and to the source lines SL. Each memory cell MC11 comprises a selection transistor ST comprising a (source or drain) conduction terminal connected to one terminal of a variable-resistance element VZ the other terminal of which is connected to one of the bit lines BL. The other conduction terminal of the selection transistor ST is connected to one of the source lines SL, and the gate terminal of the transistor ST is connected to one of the word lines WL. To decrease the area occupied by each memory cell, it has been proposed to produce the memory cells in pairs sharing one and the same conduction region SDP connected to one source line SL, as in FIG. 2. In this embodiment, the trench isolation ST1 to the left in FIG. 1A is replaced by a gate, such as the gate GT, forming the gate of the selection transistor of the other memory cell of the pair of memory cells.

It would be desirable to further decrease the substrate area occupied by a memory cell comprising a variable-resistance element.

BRIEF SUMMARY

Embodiments relate to a memory cell comprising a selection transistor having a control gate and a first conduction terminal connected to a variable-resistance element, the memory cell being formed in a wafer comprising a semiconductor substrate covered with a first insulating layer, the insulating layer being covered with an active layer made of a semiconductor, the gate being formed on the active layer and having a lateral flank covered with a second insulating layer, the variable-resistance element comprising a first layer covering a lateral flank of the active layer in a trench formed through the active layer along the lateral flank of the gate and reaching the first insulating layer, and a second layer made of a variable-resistance material.

According to one embodiment, the first and second layers form one and the same layer.

According to one embodiment, the first layer covers a lateral flank of a conductive trench.

According to one embodiment, an upper portion of the first layer makes contact with a conductive layer lying in a plane parallel to the surface of the substrate.

According to one embodiment, the first layer covers a lateral flank of a trench isolation formed under the conductive layer.

According to one embodiment, the second layer lies in a plane parallel to the surface of the substrate and makes contact with an upper portion of the first layer that provides a heating-element function for heating the second layer in order to make it change phase between a very poorly conductive amorphous phase and a very conductive crystalline phase.

Embodiments may also relate to a memory comprising at least two memory cells such as defined above, the control gate of each memory cell being connected to a word line of the memory, the variable-resistance element of each memory cell being connected to a bit line of the memory, and the selection transistor of each memory cell comprising a second conduction terminal connected to a source line of the memory.

According to one embodiment, the variable-resistance elements of the two memory cells are formed in the trench and are separated from each other by the conductive trench, which is connected to one and the same bit line.

According to one embodiment, the second conduction terminal of each memory cell is shared with another memory cell of the memory.

Embodiments may also relate to a process for fabricating an integrated circuit comprising a memory cell, the process comprising steps consisting in: forming a selection transistor on a semiconductor substrate covered with a first insulating layer, the insulating layer being covered with an active layer made of a semiconductor, the selection transistor comprising a control gate and first and second conduction terminals; covering with a second insulating layer a lateral flank of the control gate on the same side as the first conduction terminal; producing a first trench through the active layer in the first conduction terminal, reaching the first insulating layer; depositing a first layer in the first trench, covering a lateral flank of the active layer in the trench; and depositing a second layer made of a variable-resistance material.

According to one embodiment, the first and second layers form one and the same layer.

According to one embodiment, the process comprises steps of depositing on a lateral flank of the first layer a third insulating layer, and of etching a second trench in the first layer along the third insulating layer, until the first insulating layer is reached.

According to one embodiment, the process comprises a step of filling the second trench with a conductor in order to form a conductive trench.

According to one embodiment, the process comprises steps of filling the second trench with an insulator and of depositing on the second trench a conductor making contact with the first layer made of a variable-resistance material.

According to one embodiment, the second layer lies in a plane parallel to the surface of the substrate and makes contact with an upper portion of the first layer that provides a heating-element function for heating the second layer in order to make it change phase between a very poorly conductive amorphous phase and a very conductive crystalline phase.

BRIEF DESCRIPTION OF THE SEVERAL VIEWS OF THE DRAWINGS

Nonlimiting exemplary embodiments of the disclosure will be described below with reference to the appended figures, in which.

DETAILED DESCRIPTION

Figure 3A:
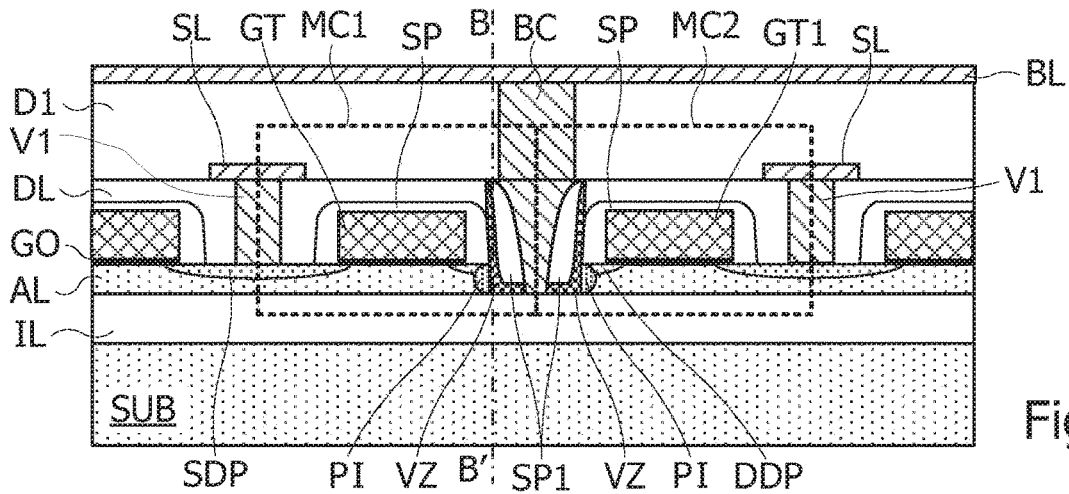
FIGS. 3A, 3B and 3C schematically show a semiconductor substrate in which are formed memory cells comprising a variable-resistance element, according to one embodiment, in transverse cross section, in longitudinal cross section and from above, respectively.
Figure 3B:
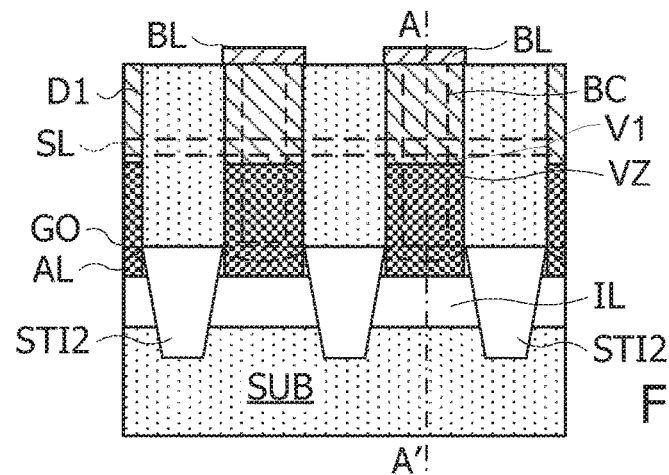
Figure 3C:
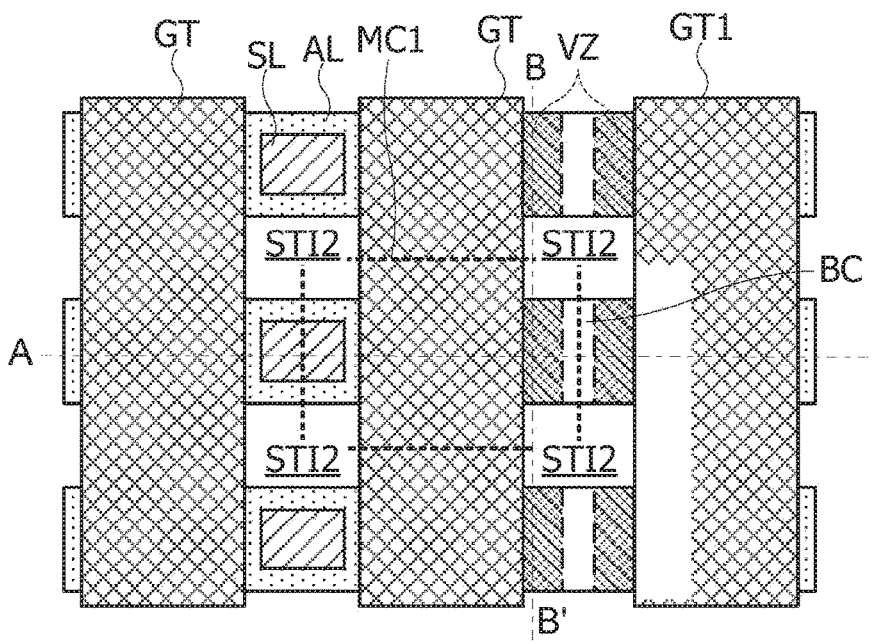

FIGS. 3A, 3B and 3C show a semiconductor substrate SUB on which has been formed a memory cell MC1 comprising a variable-resistance element VZ, according to one embodiment. FIG. 3A is a cross-sectional view of the plane AA' indicated in FIG. 3B, and FIG. 3B is a cross-sectional view of the plane BB' indicated in FIG. 3A. The substrate SUB is a silicon-on-insulator (SOI) substrate and comprises an insulating layer IL formed on one side of the substrate SUB and an active layer AL made of a semiconductor, for example of silicon, formed on the insulating layer IL. The substrate SUB may be a fully depleted SOI (FDSOI) substrate.

The memory cell MC1 contains a selection transistor comprising a gate GT formed on the substrate SUB, and conduction regions SDP and DDP formed on the two sides of the gate GT, respectively. The gate GT is made of a conductor such as doped polysilicon, on an insulating layer GO, for example of the oxide $SiO_2$, deposited on the active layer AL. The gate GT forms a channel region between the regions DDP and SDP. The regions SDP and DDP are produced by implanting dopants into the active layer AL. The region SDP thus forms a conduction region common to the selection transistors of the memory cell MC1 and of an adjacent memory cell. A via connects the region SDP to a source line SL. The gate GT is covered with a dielectric layer SP forming spacers on the lateral flanks of the gate GT. The memory cell MC1 is covered with one or more layers DL, D1 made of a dielectric insulator that may also be the oxide $SiO_2$ or a metal oxide.

According to one embodiment, a trench is produced between the spacers SP of the gate GT and an adjacent gate GT1, through the active layer AL in the region DDP, until the insulating layer IL is reached. A layer made of a variable-resistance material is deposited and etched so as to form variable-resistance elements VZ covering the spacers SP, a portion of the bottom of the trench between the spacers SP, and in particular lateral flanks of the active layer AL in the trench. Beforehand, barriers PI impermeable to the diffusion of species present in the layer VZ towards the active layer AL are produced, for example by siliciding the silicon forming the active layer AL. The barriers PI make it possible to prevent the material forming the layer VZ from polluting the active layer AL forming the selection transistor. Spacers SP1 are formed on the lateral flanks of the trench covered with the variable-resistance elements VZ. The trench is filled with a conductor so as to form a conductive trench BC reaching the insulating layer IL between the variable-resistance elements VZ, without making contact with the upper portion of the elements VZ. In FIGS. 3B and 3C, adjacent memory cells are isolated from each other by adjacent trench isolations STI2 formed in the active layer AL and reaching the insulating layer IL. The conductive trench BC and the variable-resistance elements VZ are cut into sections above the trench isolation STI2, in order to isolate each memory cell from adjacent memory cells located beyond adjacent trench isolations STI2, and thus prevent conductive filaments from forming between two bit lines BL within the material forming the elements VZ.

The variable-resistance layer VZ may be made of a chalcogenide glass such as GST, an alloy of germanium, antimony and tellurium ($Ge_2Sb_2Te_5$). If a sufficiently high current is applied thereto, this material gets hot and may therefore change phase between an amorphous phase and a crystalline phase depending on the cooling rate applied to the material. There is therefore no need for the latter to be associated with a heating element.

Figure 1A:
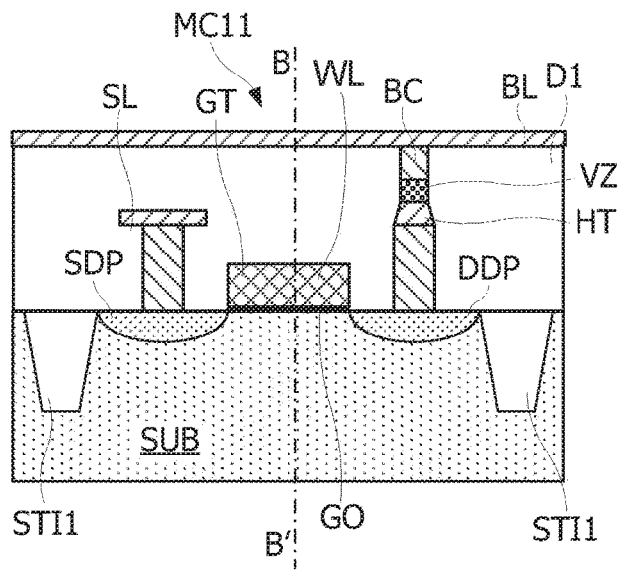
FIGS. 1A and 1B, described above, schematically show in transverse and longitudinal cross sections, respectively, a semiconductor substrate in which has been formed a conventional memory cell comprising a variable-resistance element.
Figure 1B:
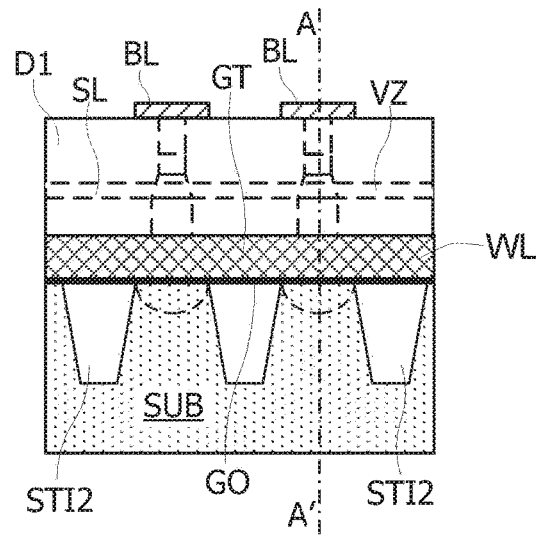

By virtue of these arrangements, the layer made of variable-resistance material forms a variable-resistance element VZ both for the memory cell MC1 and the adjacent memory cell MC2 comprising the gate GT1. Thus, the memory cell structure just described makes it possible to obtain a relatively substantial saving in substrate area by virtue of the fact that the connection to the bit line BL of the variable-resistance elements of adjacent memory cells MC1 and MC2 is shared by the two memory cells. Relative to the structure shown in FIGS. 1A and 1B, the memory cell structure shown in FIGS. 3A to 3C allows a saving in substrate area of about 29% while preserving the dimensions of the constituent elements of the memory cells.

Figure 4A:
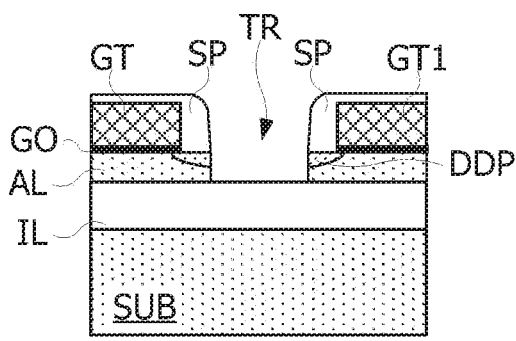
FIGS. 4A to 4D schematically show in transverse cross section a semiconductor substrate at various stages of fabrication of a memory cell such as the cell in FIG. 3A, according to one embodiment.

FIGS. 4A to 4D show a portion of the substrate SUB on which has been formed a pair of memory cells. FIG. 4A shows the substrate after the gates GT, GT1 have been formed and spacers SP formed on the lateral flanks of the gates GT, GT1. In a fabrication step illustrated by FIG. 4A, a trench TR is formed in the active layer AL between the spacers SP formed along the gates GT, GT1, the trench TR being produced so as to reach the insulating layer IL.

Figure 4B:
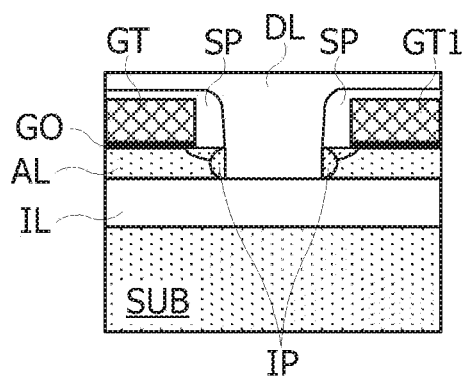

In the following fabrication steps, illustrated by FIG. 4B, the flanks of the trench TR in the active layer AL are insulated, so as to form insulating elements IP in the active layer AL in the vicinity of the lateral flanks of the trench TR. This operation is for example carried out by nitriding the silicon forming the active layer AL. The substrate SUB is then covered with a dielectric layer DL, including in the trenches TR. The layer DL is for example made of a metal oxide.

Figure 4C:
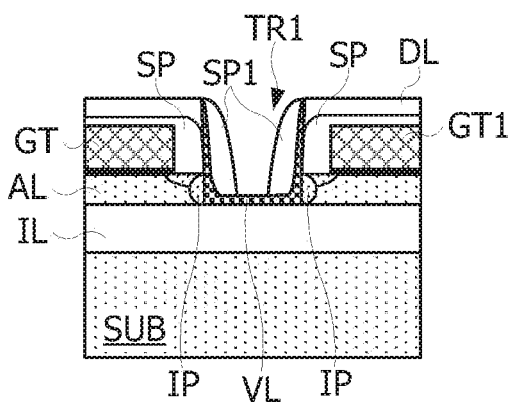

In the following fabrication steps, illustrated by FIG. 4C, the layer DL is etched so as to form a trench TR1 corresponding to the trench TR, while leaving behind a portion of the layer DL on the gates GT, GT1. The surface of the substrate and the trenches TR1 are then covered with a layer VL of substantially uniform thickness of the material intended to form the variable-resistance elements. Spacers SP1 are formed on the flanks of the trench TR1 covered with the layer VL, which is for example made of GST.

Figure 4D:
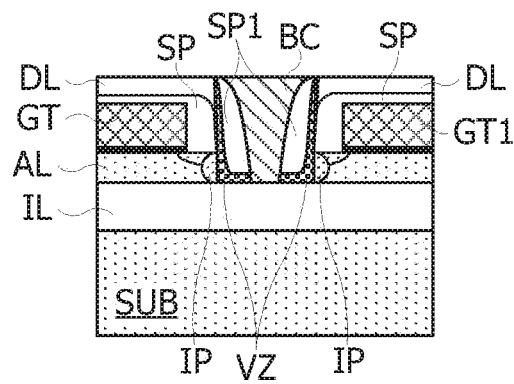

In the following fabrication steps, illustrated by FIG. 4D, the layer VL not covered with the spacers SP1 is etched until the insulating layer at the bottom of the trench TR1 is reached between the spacers SP1, so as to singulate the variable-resistance elements VZ. The formation of the spacers SP, SP1 makes it possible to ensure that the region exposed at the bottom of the trench TR1 is centered between the gates GT, GT1. The trench TR1 is then filled with a conductor in order to form a conductive trench BC. For this purpose, the walls and the bottom of the trench TR1 may for example be covered with a conductive layer of substantially uniform thickness, for example made of titanium or titanium nitride. The trench TR1 may then be filled with a metal such as tungsten or copper. In the following steps, vias V1 (see FIG. 3A) connecting the regions SDP may be formed in the layer DL, and source lines SL connected to the vias V1 may be formed on the layer DL. All of the substrate (layer DL and source lines SL) is covered with the dielectric layer D1 (FIG. 3C), which is then etched in order to form therein a via connecting the conductive trench BC to a bit line BL. The layers DL, D1 may be made of PMD (polysilicon metal dielectric).

Figure 5:
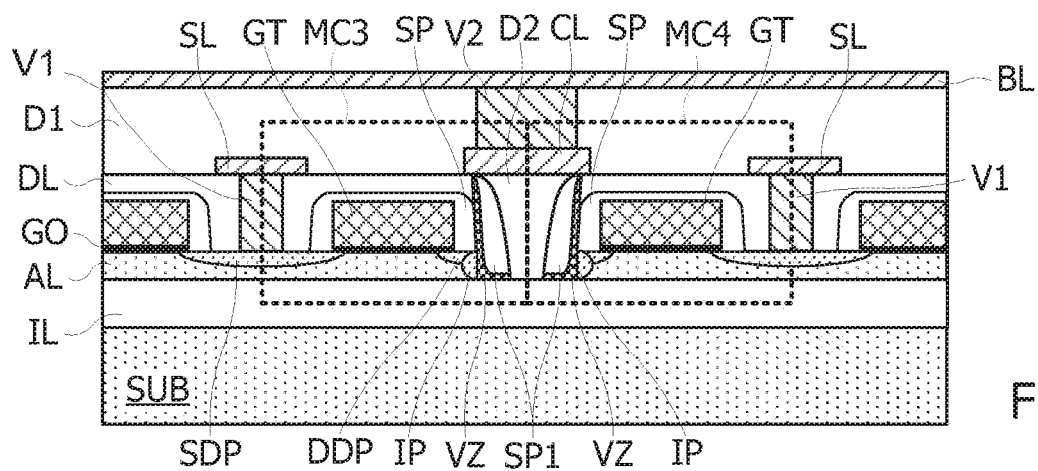
FIGS. 5 and 6 schematically show in transverse cross section a semiconductor substrate in which are formed memory cells comprising a variable-resistance element, according to other embodiments.

FIG. 5 shows a semiconductor substrate SUB on which have been formed memory cells MC3, MC4, each comprising a variable-resistance element VZ, according to another embodiment. The memory cells MC3, MC4 differ from the memory cells MC1, MC2 in that the trench TR1 between the spacers SP1 is filled with a dielectric material D2, and a conductive layer CL is formed above the trench TR1 on the material D2, so as to make electrical contact with an upper region of the elements VZ. The layer CL may be connected to a bit line BL by a via V2. It will be noted that the via V2 may directly connect the element VZ to the bit line BL. The layer D2 may be made of PMD.

Figure 6:
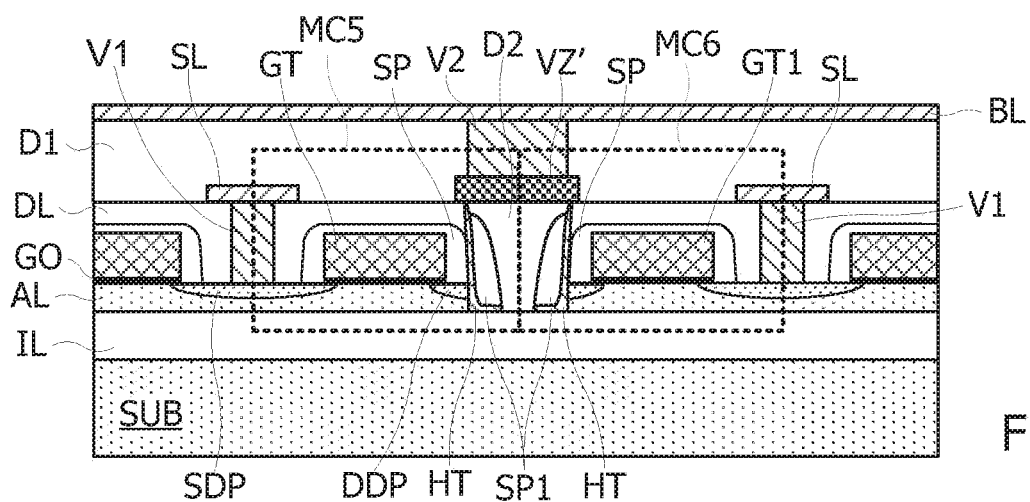

FIG. 6 shows a semiconductor substrate SUB on which have been formed memory cells MC5, MC6 sharing one and the same variable-resistance element VZ', according to another embodiment. The memory cells MC5, MC6 differ from the memory cells MC3, MC4 in that the variable-resistance elements VZ of the memory cells MC3, MC4 are replaced by heating elements HT of the same form and that are therefore able to be produced in the same way, simply by replacing the layer VL with a layer made of a resistive material that dissipates heat at the voltages liable to be applied between the source-line SL and bit-line BL contacts of a given memory cell. The conductive layer CL of the memory cells MC3, MC4 is also replaced by the variable-resistance element VZ' formed in a layer made of a variable-resistance material. The element VZ' is produced so as to make electrical contact with an upper portion of each of the heating elements HT of the memory cells MC5, MC6. In this way, when one of the memory cells MC5, MC6 must be programmed or erased, a current is made to flow through the element HT of the memory cell and through the element VZ', thereby heating the heating element HT. This results in the element VZ' being heated locally by the element HT in a region located in the vicinity of the zone of contact with the heating element HT. As a result, this region may change state between the crystalline phase and the amorphous phase. The regions of the variable-resistance layer of the element VZ' in the vicinity of the zone of contact with one of the heating elements HT of the memory cells MC5, MC6 are sufficiently far from each other that, if one of these regions changes (amorphous/crystalline) phase, the other of these regions does not change phase.

It will be noted that in the embodiment illustrated in FIG. 6, it is not necessary to form the insulating elements IP since the GST does not make contact with a semiconductor such as that of the active layer AL.

In the embodiments in FIGS. 5 and 6, the spacers SP1 may be omitted since it is not necessary to center the elements relative to one another.

Figure 7:
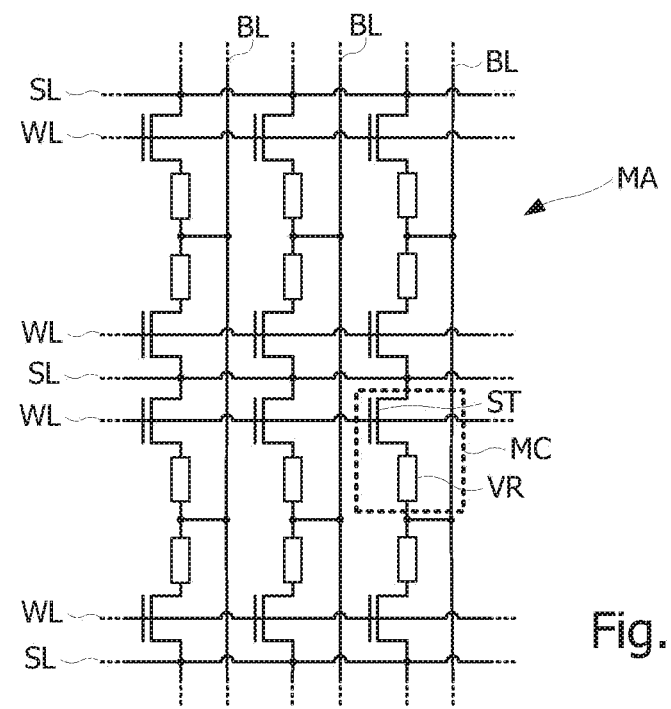
FIG. 7 schematically shows the electric circuit of one portion of a memory plane comprising memory cells containing a variable-resistance element, such as those in FIG. 3A, 5 or 6.

FIG. 7 schematically shows the electric circuit of one portion of a memory plane MA comprising memory cells MC containing a variable-resistance element VR, such as the memory cell MC1, MC3 or MC5. The memory plane MA comprises bit lines BL, word lines WL perpendicular to the bit lines BL and source lines SL perpendicular to the bit lines BL. Each memory cell MC comprises a selection transistor ST and a variable-resistance element VR such as the element VZ shown in FIG. 3A or 5, or the combination of a heating element HT with the layer VZ' shown in FIG. 6. The transistor ST comprises a (source or drain) conduction terminal connected to one terminal of the variable-resistance element VR the other terminal of which is connected to one of the bit lines BL. The other (drain or source) conduction terminal of the selection transistor ST is connected to one of the source lines SL. The transistor ST comprises a gate terminal connected to one of the word lines WL. The resistance of the element VR may be changed between a highly resistant state when the material forming the element VR is placed in an amorphous phase and a weakly resistant state when the material forming the element VR is placed in a crystalline phase.

Figure 2:
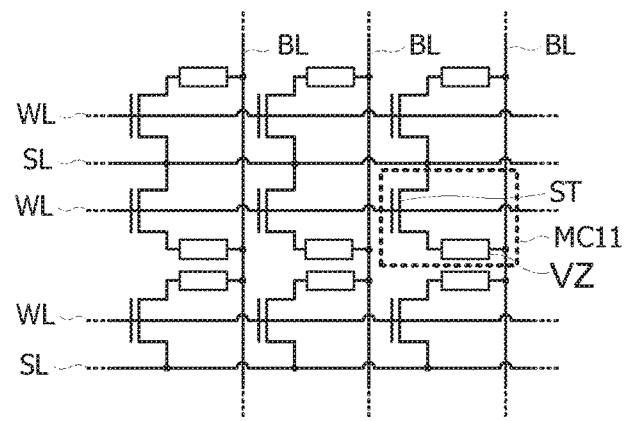
FIG. 2, described above, schematically shows the electric circuit of one portion of a memory plane comprising memory cells containing a variable-resistance element, such as that in FIGS. 1A and 1B.

Relative to the memory plane in FIG. 2, a substantial saving in substrate area is obtained because each memory cell of the memory plane MA shares a point of connection to a bit line BL with another memory cell of the memory plane, in addition to sharing a point of connection to a source line SL of another memory cell.

It will be noted that the conduction regions DDP, SDP of the selection transistor ST may irrespectively form a drain terminal and a source terminal of the transistor, and that the functions of the bit line BL and source line SL may be inverted.

The various memory cell embodiments described above may be produced on an FDSOI (fully depleted SOI) type substrate, with an active layer AL and an insulating layer IL of thicknesses of about 7 nm and 25 nm, respectively. The substrate employed may also be a PDSOI (partially depleted SOI) type substrate, with an active layer AL and an insulating layer IL of thicknesses of about 25 nm and 100 nm, respectively.

It will be clearly apparent to those skilled in the art that various variant embodiments of the present disclosure are possible and that it has various applications. In particular, the disclosure is not limited to a memory, but also encompasses a single memory cell formed in an SOI substrate. In this case in particular, it is not necessary to provide for self-centering of the contact BC in the variable-resistance material, since only a single variable-resistance element will be produced.

It will also be noted that the memory cell may be produced on a conventional semiconductor substrate on which an insulating layer (IL) has been deposited, the semiconductor layer AL being formed on the insulating layer, for example by epitaxy.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for fabricating a memory cell, the process comprising:
   covering a semiconductor substrate with a first insulating layer;
   covering the first insulating layer with an active layer of a semiconductor material;
   forming a first control gate and first and second conduction regions of a first selection transistor;
   covering, with a second insulating layer, a lateral flank of the first control gate on the same side as the first conduction region;
   forming a first trench through the active layer in the first conduction region, reaching the first insulating layer;
   depositing a first layer in the first trench, covering a first lateral flank of the active layer in the trench; and
   depositing a second layer in contact with the first layer, wherein the second layer is a variable-resistance material, extends longitudinally in a plane parallel to the surface of the substrate and makes contact with an upper portion of the first layer, the first layer including a first resistor configured to heat the second layer in order to make the second layer change phase between a non-conductive amorphous phase and a conductive crystalline phase.

2. The process according to claim 1, comprising depositing, on a lateral flank of the first layer, a third insulating layer, and etching a second trench in the first layer along the third insulating layer, until the first insulating layer is reached.

3. The process according to claim 2, comprising filling the second trench with a dielectric material that contacts the second layer.

4. The process according to claim 1, further comprising:
   forming a second control gate and a third conduction terminal of a second selection transistor; and
   covering, with the second insulating layer, a lateral flank of the second control gate.

5. The process according to claim 4, in which depositing the first layer in the first trench includes covering a bottom and a second lateral flank of the active layer in the trench.

6. The process according to claim 5, comprising:
   forming first and second insulating spacers on first and second lateral flanks of the first layer, respectively, the first and second insulating spacers leaving exposed a central portion of the first layer; and
   etching a second trench through the central portion of the first layer while the first and second lateral flanks of the first layer are protected by the first and second insulating spacers, respectively.

7. The process according to claim 6, wherein the first resistor contacts the second layer at a first contact portion and etching the second trench includes dividing the first layer into the first resistor and a second resistor.

8. A process, comprising:
   forming a first insulating layer covering a surface of a semiconductor substrate;
   covering the first insulating layer with an active layer of a semiconductor material;
   a control gate of a first selection transistor, the control gate being formed on the active layer and having a lateral flank;
   a second insulating layer covering the lateral flank of the control gate;
   first and second conduction regions of the first selection transistor, the first and second conduction regions being formed in the active layer;
   a trench formed through the active layer, the trench being defined on a first side by a first lateral flank of the active layer and reaching the first insulating layer;
   covering the first lateral flank of the active layer by depositing a first layer of resistive material in the trench; and
   depositing a second layer of a variable resistance material in contact with the first layer and electrically coupled to the first conduction terminal, the first layer of resistive material being configured to heat the second layer and make the second layer change phase between a non-conductive amorphous phase and a conductive crystalline phase.

9. The process of claim 8, in which the second layer contacts an upper portion of the first layer, and extends longitudinally in a plane parallel to the surface of the substrate.

10. The process of claim 9, further comprising forming a dielectric trench isolation formed under the second layer and in the trench and covering a lateral flank of the first layer.

11. The process of claim 8, wherein:
the second insulating layer extends above the control gate;
the first layer extends upwardly from the trench along the second insulating layer and reaches a top surface of the second insulating layer; and
the second layer is positioned above the second insulating layer.

12. The process of claim 8, further comprising forming a second selection transistor, wherein the trench is between the first selection transistor and the second selection transistor.

13. A process, comprising:
covering a surface of the semiconductor substrate with a first insulating layer;
covering the first insulating layer with a semiconductor active layer;
forming a control gate of a first selection transistor of a first memory cell on the active layer and having, the control gate being formed on the active layer and having a lateral flank;
covering the lateral flank of the control gate with a second insulating layer;
forming first and second conduction regions of the first selection transistor in the active layer;
forming a first layer of resistive material in the trench, extending in the active layer and contacting the first conduction region of the first selection transistor;
forming a variable-resistance element electrically coupled to the first conduction region of the first selection transistor and including the first layer of resistive material and including a second layer contacting the first layer, wherein second layer is made of a variable-resistance material, the first layer of resistive material configured to heat the second layer;
forming a wordline coupled to the first memory cell;
forming a bitline coupled to the first memory cell; and
forming a source line coupled to first the memory cell.

14. The process of claim 13, further comprising:
forming a trench through the active layer, wherein the first layer extends in the trench through the active layer, covers a first lateral flank of the active layer, and contacts a first contact portion of the second layer; and
forming a second memory cell by forming a third layer of resistive material extending in the trench, covering a second lateral flank of the active layer, and contacting a second contact portion of the second layer.

15. The process of claim 14, wherein forming the second memory cell includes forming a second selection transistor by:
forming a control gate of the second selection transistor on the active layer and having a lateral flank;
covering the lateral flank of the control gate of the second selection transistor with a third insulating layer;
forming first and second conduction regions of the second selection transistor in the active layer, wherein the third layer contacts the first conduction region of the second selection transistor.

16. The process claim 15, wherein the second conduction terminal of the first selection transistor is shared with a third memory cell and the second conduction terminal of the second selection transistor is shared with a fourth memory cell.

17. The process claim 14, further comprising forming a dielectric trench isolation under the second layer and insulating the first layer from the third layer in the trench.

18. The process of claim 17, wherein the second layer extends longitudinally in a plane parallel to the surface of the substrate and makes contact with upper portions of the first and third layers, the first layer being configured to heat a first contact portion of the second layer and make the first contact portion of the second layer change phase between a non-conductive amorphous phase and a conductive crystalline phase, and the third layer being configured to heat a second contact portion of the second layer and make the second contact portion of the second layer change phase between the non-conductive amorphous phase and the conductive crystalline phase.

19. The process of claim 13, wherein the second layer extends longitudinally in a plane parallel to the surface of the substrate and makes contact with an upper portion of the first layer, the first layer being configured to heat a contact portion of the second layer and make the contact portion of the second layer change phase between a non-conductive amorphous phase and a conductive crystalline phase.

20. The process of claim 13, wherein:
the second insulating layer extends above the control gate of the first selection transistor;
the first layer extends upwardly from the first conduction region along the second insulating layer and reaches a top surface of the second insulating layer; and
the second layer is positioned on the second insulating layer.

* * * * *

UNITED STATES PATENT AND TRADEMARK OFFICE
CERTIFICATE OF CORRECTION

Page 1 of 1

PATENT NO. : 11,031,550 B2
APPLICATION NO. : 16/457855
DATED : June 8, 2021
INVENTOR(S) : Philippe Boivin It is certified that error appears in the above-identified patent and that said Letters Patent is hereby corrected as shown below:

In the Claims

Column 9, Line 44, Claim 13:
"first the memory" should read, --the first memory--.

Column 10, Line 14, Claim 16:
"claim" should read, --of claim--.

Column 10, Line 19, Claim 17:
"claim" should read, --of claim--.

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*